(12) United States Patent
Huo

(10) Patent No.: US 10,665,650 B2
(45) Date of Patent: May 26, 2020

(54) DISPLAY PANEL AND DISPLAY DEVICE

(71) Applicant: WuHan TianMa Micro-Electronics Co., Ltd., Wuhan (CN)

(72) Inventor: Sitao Huo, Wuhan (CN)

(73) Assignee: WuHan TianMa Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/503,490

(22) Filed: Jul. 4, 2019

(65) Prior Publication Data

US 2019/0326376 A1 Oct. 24, 2019

(30) Foreign Application Priority Data

Dec. 27, 2018 (CN) .......................... 2018 1 1606966

(51) Int. Cl.
*H01L 27/00* (2006.01)
*H01L 51/00* (2006.01)
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3216* (2013.01); *H01L 27/3262* (2013.01); *H01L 51/5228* (2013.01); *H01L 51/56* (2013.01)

(58) Field of Classification Search
CPC ............. H01L 27/3279; H01L 27/3216; H01L 27/3262; H01L 27/3246; H01L 27/3248; H01L 27/326; H01L 51/56; H01L 51/5228; H01L 51/0097; H01L 51/5225; H01L 2227/323
See application file for complete search history.

(56) References Cited

U.S. PATENT DOCUMENTS

| 10,276,641 | B2* | 4/2019 | Lou | ...................... H01L 51/5228 |
| 2018/0026225 | A1* | 1/2018 | Kwon | .................. H01L 51/5237 257/40 |
| 2018/0190741 | A1* | 7/2018 | Lou | ...................... H01L 51/5228 |

* cited by examiner

*Primary Examiner* — Nikolay K Yushin
(74) *Attorney, Agent, or Firm* — Kilpatrick Townsend & Stockton, LLP

(57) ABSTRACT

A display panel, comprising: a base substrate, an array layer on the base substrate; an anode on a side of the array layer facing away from the base substrate; a pixel defining layer located on a side of the anode facing away from the base substrate and having a second opening and a first opening which exposes the anode and defines an organic light-emitting layer; a first island portion located on a side of the pixel defining layer facing away from the base substrate and having a via hole which corresponds to the second opening; an auxiliary conductive portion between the pixel defining layer and the base substrate; and a cathode located on sides, facing away from the base substrate, of the organic light-emitting layer, the pixel defining layer, and the first island portion and electrically connected to the auxiliary conductive portion through the via hole and the second opening.

19 Claims, 12 Drawing Sheets

DISPLAY PANEL AND DISPLAY DEVICE

CROSS-REFERENCE TO RELATED APPLICATIONS

The present disclosure claims priority to Chinese Patent Application No. 201811606966.4, filed on Dec. 27, 2018, the content of which is incorporated herein by reference in its entirety.

FIELD

The present disclosure relates to the field of display technologies, and in particular, to a display panel and a display device.

BACKGROUND

In order to realize the image display, a plurality of light-emitting elements is arranged in the display panel, and each light-emitting element includes an anode, an organic light-emitting layer and a cathode. At present, the cathodes in the display panel generally adopt a transparent conductive material that is evaporated with an integral surface, and have a small thickness and large resistance. As a result, when a negative power signal flows through the cathode, a large voltage drop will be generated, thereby affecting the display uniformity.

In order to overcome the above problems, some auxiliary conductive portions are usually additionally provided in the display panel in the related art so as to reduce a total resistance of the cathodes by electrically connecting the cathodes to the auxiliary conductive portions. However, based on the current process, the connection stability between the cathodes and the auxiliary conductive portions is poor, such that it is impossible to effectively achieve the reduction in the total resistance of the cathodes.

SUMMARY

In view of this, the embodiments of the disclosure provide a display panel and a display device, which improves the connection stability between a cathode and an auxiliary conductive portion under the premise of achieving a high aperture ratio, thereby improving the display uniformity.

In one embodiment, the present disclosure provides a display panel, including: a base substrate; an array layer disposed on the base substrate; an anode located on a side of the array layer facing away from the base substrate; a pixel defining layer located on a side of the anode facing away from the base substrate, the pixel defining layer having a first opening and a second opening, and the first opening exposing the anode; a first island portion located on a side of the pixel defining layer facing away from the base substrate, the first island portion having a via hole, the via hole corresponding to the second opening, and the via hole penetrating through the first island portion in a direction perpendicular to the base substrate; an organic light-emitting layer located on the side of the anode facing away from the base substrate, the organic light-emitting layer being defined by the first opening; a cathode located on sides, facing away from the base substrate, of the organic light-emitting layer, the pixel defining layer, and the first island portion; and an auxiliary conductive portion located between the pixel defining layer and the base substrate; and the cathode is electrically connected to the auxiliary conductive portion through the via hole and the second opening.

In another embodiment, the present disclosure provides a method for fabricating the above-mentioned display panel, including: providing a base substrate and forming an array layer, an anode, and an auxiliary conductive portion on the base substrate; forming a pixel defining layer and a first island portion, the pixel defining layer having a first opening and a second opening, the first opening exposing the anode, the first island portion having a via hole, the via hole corresponding to the second opening, and the via hole penetrating through the first island portion in a direction perpendicular to the base substrate; forming an organic light-emitting layer in the first opening; and forming a cathode on sides, facing away from the base substrate, of the organic light-emitting layer, the pixel defining layer, and the first island portion, the cathode being electrically connected to the auxiliary conductive portion through the via hole and the second opening.

In still another embodiment, the present disclosure provides a display device including the above-mentioned display panel.

BRIEF DESCRIPTION OF DRAWINGS

In order to more clearly illustrate the embodiments of the present disclosure, the accompanying drawings used in the embodiments are briefly described below. The drawings described below are merely a part of the embodiments of the present disclosure.

DESCRIPTION OF EMBODIMENTS

For a better understanding of the embodiments of the present disclosure, the embodiments of the present disclosure are described in detail below with reference to the accompanying drawings.

It should be noted that the described embodiments are merely some embodiments of the present disclosure, but not all of the embodiments.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein merely indicates an association relationship to describe the associated objects, meaning that there may be three relationships, for example, A and/or B may indicate three cases: only A exists; both A and B exist; and only B exists. In addition, the character "/" as used herein generally indicates that the contextual associated objects are in an "or" relationship.

It should be understood that although the terms "first" and "second" may be used to describe openings in embodiments of the disclosure, but these openings should not be limited to these terms. These terms are only used to distinguish openings from each other. For example, the first opening may also be referred to as a second opening, and similarly, the second opening may also be referred to as a first opening without departing from the scope of embodiments of the disclosure.

Figure 1:
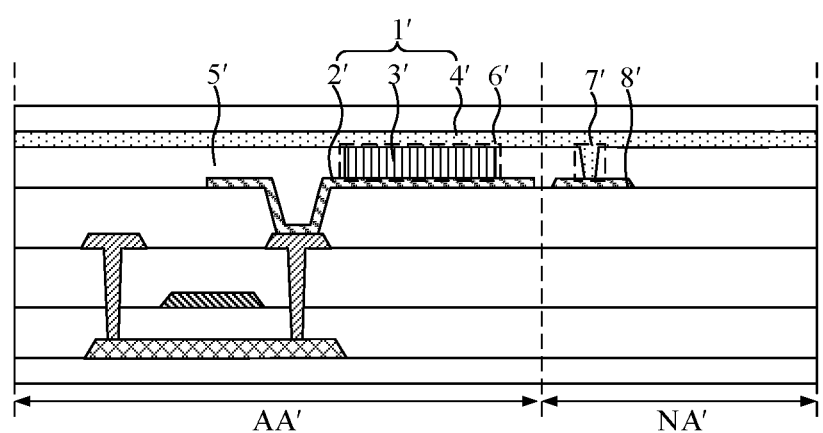
FIG. 1 illustrates a schematic cross-sectional diagram of a display panel in the related art.

As shown in FIG. 1, FIG. 1 illustrates a schematic cross-sectional diagram of a display panel in the related art. The display panel includes a display region AA' and a non-display region NA' surrounding the display region AA'. The display panel further includes a light-emitting element 1' including an anode 2', an organic light-emitting layer 3' and a cathode 4', and the anode 2', the organic light-emitting layer 3' and the cathode 4' are stacked up. A pixel defining layer 5' is provided between the anode 2' and the cathode 4', and the pixel defining layer 5' has a first opening 6' and a second opening 7'. The first opening 6' is located in the display region AA' and is used to define the organic light-emitting layer 3'. The second opening is located in the non-display region NA' and is used to achieve electrical connection between the cathode 4' and the auxiliary conductive portion 8' in the non-display region NA'.

Based on the above structure, in the fabrication process of the display panel, after forming the pixel defining layer 5' having the first opening 6' and the second opening 7', it is necessary to evaporate a luminescent material of the organic light-emitting layer 6' in the first opening 6' using a mask. However, during the evaporation process, the luminescent material is not only deposited down straight along the edge of the mask opening, but also deposited obliquely. Therefore, part of the luminescent material is deposited into the second opening 7'. Thus, when the cathode 4' is subsequently formed, the connection between the cathode 4' and the auxiliary conductive portion 8' will become unstable due to the influence from the luminescent material in the second opening 7', and in severe cases, an open circuit will also be caused, so that reduction in a total resistance of the cathode 4' cannot be effectively achieved.

In order to overcome the above problems, in the related art, the opening of the mask is usually configured to be relatively small in order to increase the distance between the edge of the opening of the mask and the second opening 7' so as to prevent the luminescent material from being deposited into the second opening 7'. However, this will cause the aperture ratio of the display panel to decrease, which affects the display performance.

Figure 2:
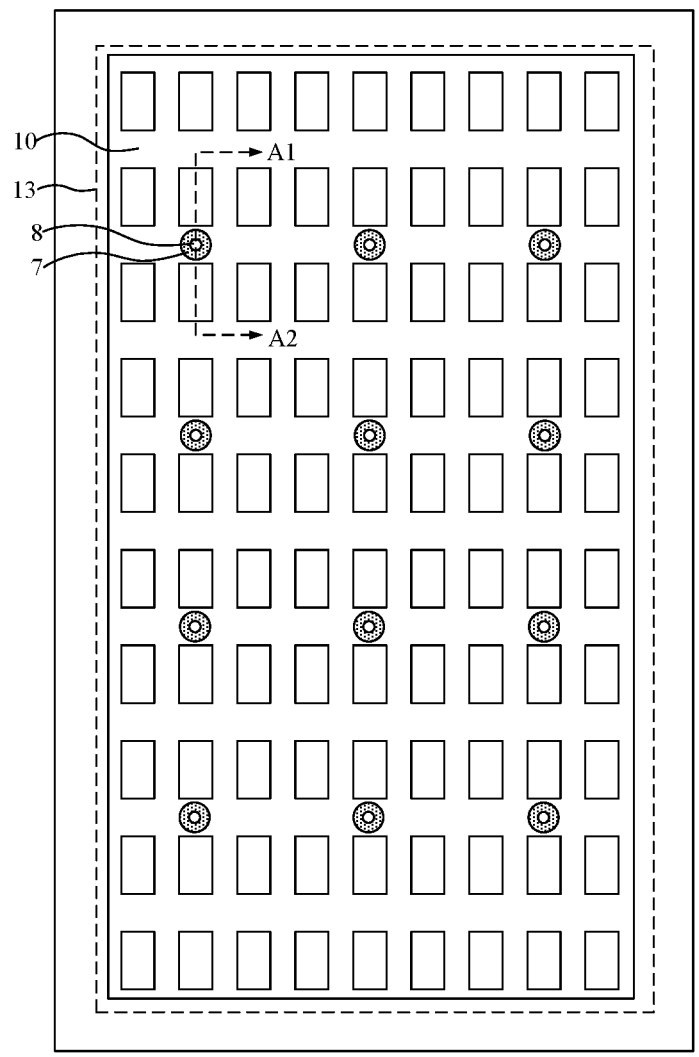
FIG. 2 illustrates a structural schematic diagram of a display panel according to an embodiment of the present disclosure.
Figure 3:
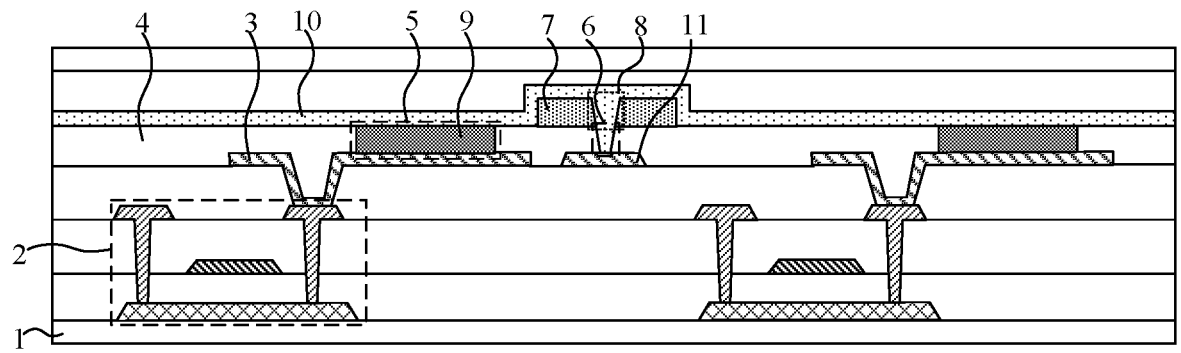
FIG. 3 illustrates a cross-sectional diagram taken along the line A1-A2 in FIG. 2.

In view of the above, an embodiment of the present disclosure provides a display panel. FIG. 2 illustrates a structural schematic diagram of the display panel according to the embodiment of the present disclosure. FIG. 3 illustrates a cross-sectional diagram taken along the line A1-A2 in FIG. 2. As shown in FIG. 2 and FIG. 3, the display panel includes: a base substrate 1 on which an array layer 2 is provided; an anode 3 located on a side of the array layer 2 facing away from the base substrate 1; a pixel defining layer 4 located on a side of the anode 3 facing away from the base substrate 1, the pixel defining layer 4 including a first opening 5 and a second opening 6, the first opening 5 exposing the anode 3; a first island portion 7 located on a side of the pixel defining layer 4 facing away from the base substrate 1, the first island portion 7 including a via hole 8, the via hole 8 corresponding to the second opening 6, the via hole 8 penetrating through the first island portion 7 in a direction perpendicular to the base substrate 1; an organic light-emitting layer 9 located on a side of the anode 3 facing away from the base substrate 1 and defined by the first opening 5; a cathode 10 located on sides, facing away from the base substrate 1, of the organic light-emitting layer 9, the pixel defining layer 4, and the first island portion 7; and an auxiliary conductive portion 11 located between the pixel defining layer 4 and the base substrate 1. The cathode 10 is electrically connected to the auxiliary conductive portion 11 through the via hole 8 and the second opening 6. The island portion according to the present disclosure can be reused as a photo spacer.

Figure 4:
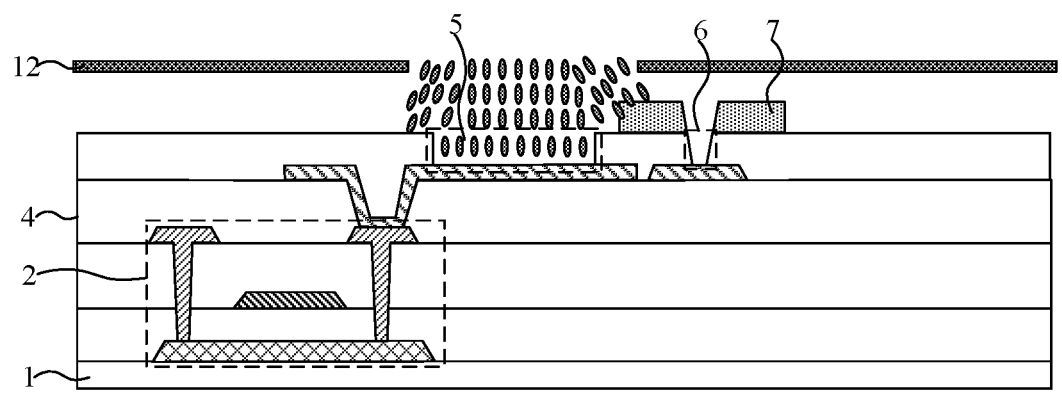
FIG. 4 illustrates a schematic diagram showing deposition of a luminescent material according to the embodiment of the present disclosure.

In the display panel provided by the embodiment of the present disclosure, the first island portion 7 is provided on the side of the pixel defining layer 4 facing away from the base substrate 1. FIG. 4 illustrates a schematic diagram showing the deposition of the luminescent material according to an embodiment of the present disclosure. In conjunction with FIG. 4, after the pixel defining layer 4 is formed, the first island portion 7 is first formed on the pixel defining layer 4, and then the organic light-emitting layer 9 is formed with the luminescent material by using a high-precision metal mask 12. During the deposition process of the luminescent material, the first island portion 7 will block the luminescent material, such that the luminescent material can be prevented from being deposited into the second opening 6 even if the luminescent material is deposited obliquely along the opening of the high-precision metal mask 12, thereby achieving a stable electrical connection between the cathode 10 and the auxiliary conductive portion 11. Moreover, with the display panel, there is no need to increase the distance between the opening of the high-precision metal mask 12 and the second opening 6, and therefore, it is not necessary to reduce the area of the opening of the high-precision metal mask 12, thereby allowing a high aperture ratio of the display panel.

It can be seen that, when adopting the display panel provided by the embodiment of the present disclosure, by blocking the luminescent material with the first island portion 7, the connection stability between the cathode 10 and the auxiliary conductive portion 11 is improved and the total resistance of the cathode 10 is effectively reduced under the premise that the display panel has a high aperture ratio, thereby reducing the difference in the voltage drop of the negative power signal generated when the negative power signal is transmitted at different regions of the cathode 10 and improving the display uniformity.

It should be noted that the negative power signal trace for providing the negative power signal to the cathode 10 is set to extend in the non-display region surrounding the display region 13. With reference to FIG. 1 again, the auxiliary conductive portion 8' is located in the non-display region NA' in the related art, and with such configuration, not only the width of the border is increased, but also a large voltage drop will be generated by the negative power signal in the display region AA' when the negative power signal flows through the cathode 4' of the display region AA', such that the difference between signal attenuations at different regions of the display region AA' is large.

With reference to FIG. 2 again, in the embodiment of the present disclosure, the base substrate 1 includes the display region 13, and the first island portion 7 is located in the display region 13. The display region 13 of the base substrate 1 should be interpreted as an area corresponding to a display area of the display panel. By arranging the first island portion 7 in the display region 13, on the one hand, the cathode 10 is electrically connected to the auxiliary conductive portion 11 through the via hole 8 of the first island portion 7, such that the total resistance of the cathode 10 in the display region 13 can be effectively reduced, thereby reducing the difference in the attenuation degree of the negative power signal when the negative power signal flows through different regions of the cathode 10; on the other hand, the first island portion 7 and the auxiliary conductive portion 11 do not need to occupy a space in the non-display region, so as to better realize a narrow border design of the display panel.

Figure 5:
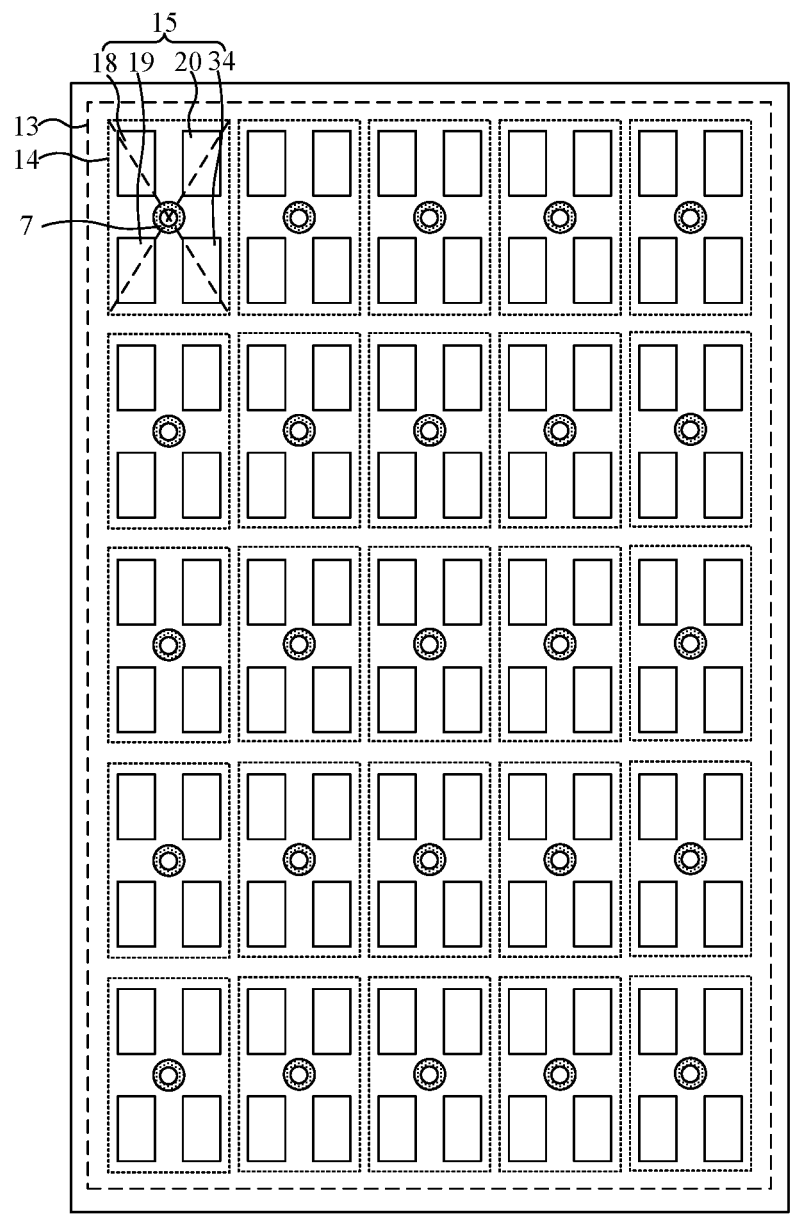
FIG. 5 illustrates a schematic diagram showing an arrangement of the first island portions according to an embodiment of the present disclosure.

FIG. 5 illustrates a schematic diagram showing the arrangement of the first island portion according to an embodiment of the present disclosure. As shown in FIG. 5, the display region 13 includes a plurality of pixel regions 14. Each pixel region 14 includes a plurality of sub-pixels 15; each of the pixel regions 14 is provided with a first island portion 7.

It should be noted that when the display panel includes sub-pixels 15 of m colors, each of the pixel regions 14 includes m sub-pixels 15 whose colors are different from each other. Exemplarily, with reference to FIG. 5 again, the display panel includes sub-pixels of four different colors, namely, red sub-pixels 18, green sub-pixels 19, and blue sub-pixels 20 and yellow sub-pixels 34. Each of the pixel regions 14 includes one red sub-pixel 18, one green sub-pixel 19, one blue sub-pixel 20, and one yellow sub-pixel 34.

Each of the pixel regions 14 is provided with one first island portion 7, so that the first island portions 7 can be evenly distributed in the display region 13. In one embodiment, the cathode 10 can be electrically connected to the auxiliary conductive portion 11 through the via hole 8 of the first island portion 7 in each of the pixel regions 14, thereby uniformly reducing the resistance of the cathode 10 at different regions of the display region 13; and in another embodiment, since the first island portion 7 has a certain thickness, uniformly distributing the first island portions 7 in the display region 13 also contributes to achieving a uniform thickness of the display panel.

In some embodiments, in order to further improve regularity of the arrangement of the first island portions 7, the resistance of the cathode 10 at different regions of the display region 13 is uniformly reduced. With reference to FIG. 5 again, the first island portion 7 can be located at a geometric center of the pixel region 14.

It should be noted that the geometric center of the pixel region 14 refers to an intersection point of diagonals of the pixel region 14. It can be understood that the geometric center is defined in the embodiment of the present disclosure only for the purpose of clearly describing the arranging position of the first island portion 7, and in the display panel, the diagonals and geometric center of the pixel region 14 are not physically set. In addition, it should be noted that in the fabrication process of the first island portion 7, there is inevitably an alignment deviation, resulting that the actual arranging position of the first island portion 7 deviates from its standard position. Therefore, the first island portion 7 being located at the geometrical center of the pixel region 14 means that the first island portion 7 is located at the geometric center of the pixel region 14 within permitted error.

When the negative power signal is transmitted from the negative power signal line to the cathode 10 of the display region 13, the closer to the edge of the display region 13, the shorter the transmission distance of the negative power signal, and the smaller the attenuation degree. When the negative power signal is transmitted to a central position of the display region 13, the greater the transmission distance, and the greater the attenuation. Therefore, there is a large difference between the attenuation degree of the negative power signal at the edge of the display region 13 and the attenuation degree of the negative power signal at the center position of the display region 13.

Figure 6:
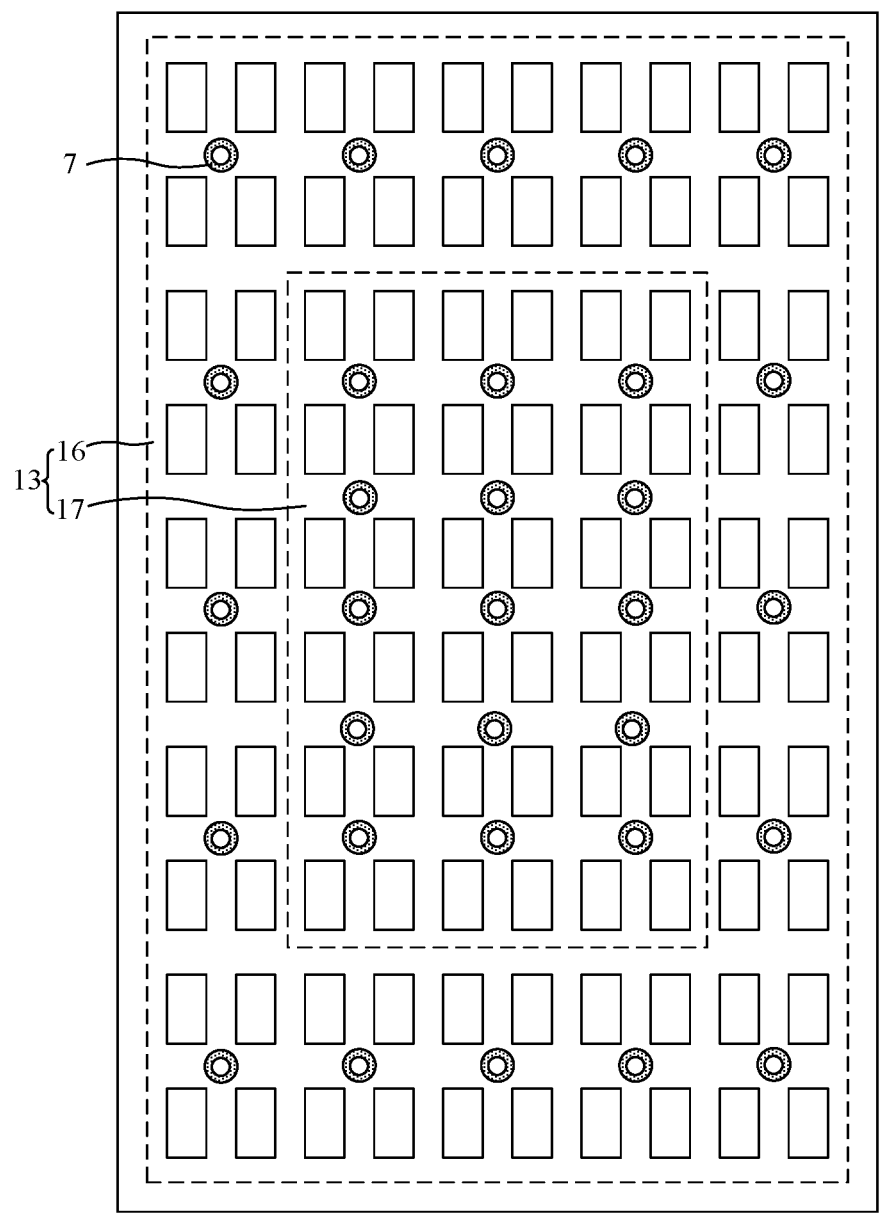
FIG. 6 illustrates a schematic diagram showing another arrangement of the first island portions according to an embodiment of the present disclosure.

Based on this, FIG. 6 illustrates a schematic diagram showing another arrangement of the first island portions according to an embodiment of the present disclosure. As shown in FIG. 6, the display region 13 includes a first display region 16 and a second display region 17. The first display region 16 is located on a side of the second display region 17 close to the edge of the display region 13. A distribution density of the first island portions 7 in the first display region 16 is smaller than a distribution density of the first island portions 7 in the second display region 17.

With such configuration, the number of the auxiliary conductive portions 11 electrically connected to the cathode 10 in the second display region 17 is relatively large, therefore, the resistance of the cathode 10 in the second display region 17 is reduced by the auxiliary conductive portions 11 to a greater extent compared to the first display region 16. Thus, when the negative power signal is transmitted on the cathode 10 in the second display region 17, the attenuation degree is relatively small, thereby reducing the difference in attenuation degree of the negative power signal when the negative power signal is transmitted in the first display region 16 and the second display region 17, and improving the display uniformity of the first display region 16 and the second display region 17.

Figure 7:
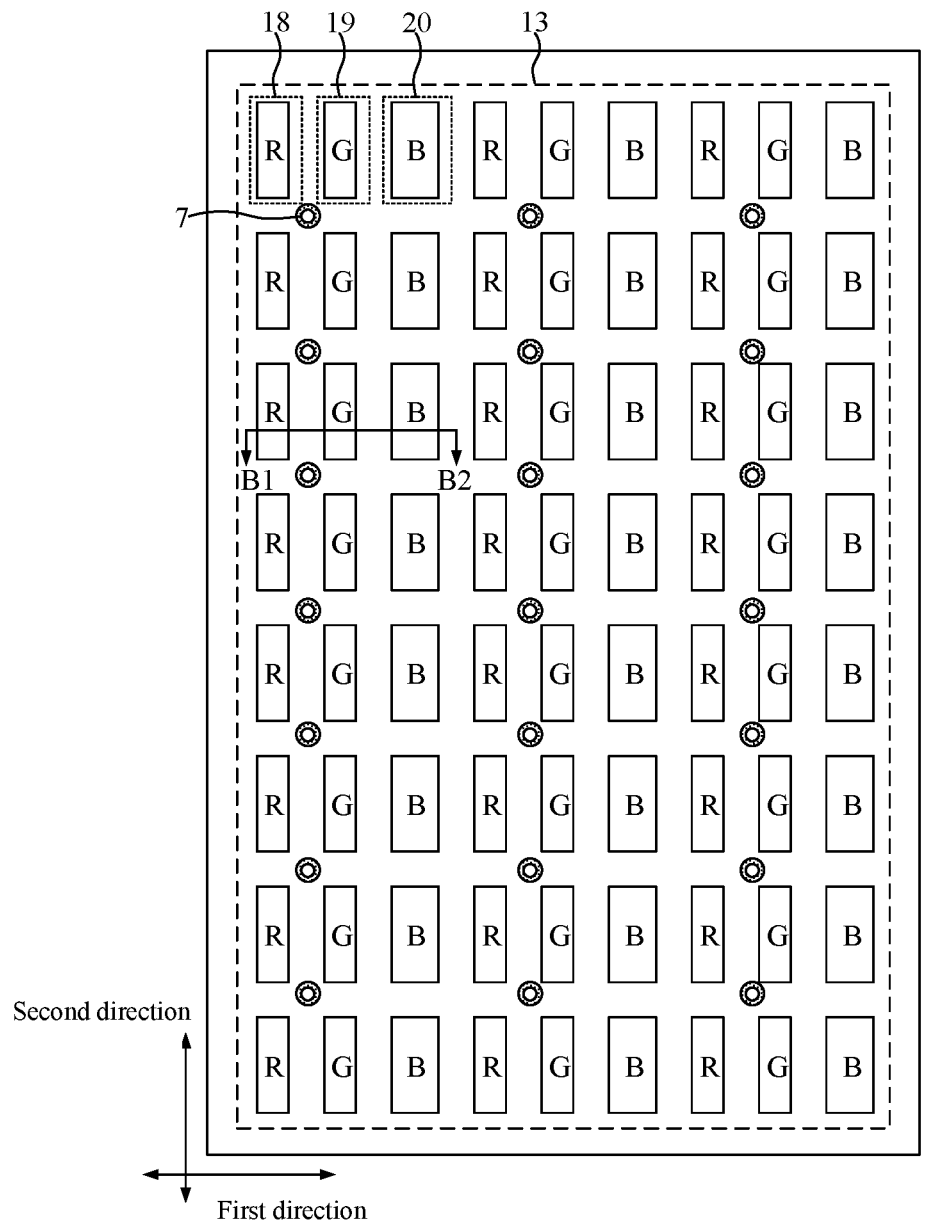
FIG. 7 illustrates a schematic diagram showing still another arrangement of the first island portions according to an embodiment of the present disclosure.

Further, FIG. 7 illustrates a schematic diagram showing still another arrangement of the first island portions according to an embodiment of the present disclosure. As shown in FIG. 7, the display region 13 includes red sub-pixels 18, green sub-pixels 19, and blue sub-pixels 20. The first island portions 7 are adjacent to the red sub-pixels 18 and/or the green sub-pixels 19, and are not adjacent to the blue sub-pixels 20.

Since the characteristics of the luminescent materials respectively forming the red sub-pixels 18, the green sub-pixels 19, and the blue sub-pixels 20 are different, the blue sub-pixels 20 have the lowest luminance when the red sub-pixels 18, the green sub-pixels 19, and the blue sub-pixels 20 are supplied with driving currents of the same magnitude. Therefore, by arranging the first island portion 7 to be adjacent to the red sub-pixel 18 and/or the green sub-pixel 19, there will be no significant impact on the overall display performance of the display region 13 even if the area of the light-emitting region in the red sub-pixel 18 and/or the green sub-pixel 19 is reduced so as to provide position in which the first island portion 7 is to be arranged. In other words, since the first island portion 7 is not adjacent to the blue sub-pixel 20, the first island portion 7 does not need to occupy the space around the blue sub-pixel 20, meanwhile, the area of the light-emitting region of the blue sub-pixel 20 can be increased correspondingly in order to lower the difference in luminance between the blue sub-pixel 20 and the red sub-pixel 18 and green sub-pixel 19.

Further, with reference to FIG. 7 again, the red sub-pixel 18, the green sub-pixel 19, and the blue sub-pixel 20 are alternately arranged in sequence in a first direction, and the sub-pixels 15 of the same color are aligned in a second direction, the first direction intersecting with the second direction. With such arrangement of the sub-pixels, the red sub-pixel 18 and the green sub-pixel 19 are adjacent to each other, so that there is a relatively large non-light-emitting region around the red sub-pixel 18 and the green sub-pixel 19, in which the first island portion 7 can be arranged, and therefore there is no need for the first island portion 7 to additionally occupy the light-emitting regions of the red sub-pixel 18 and the green sub-pixel 19.

Figure 8:
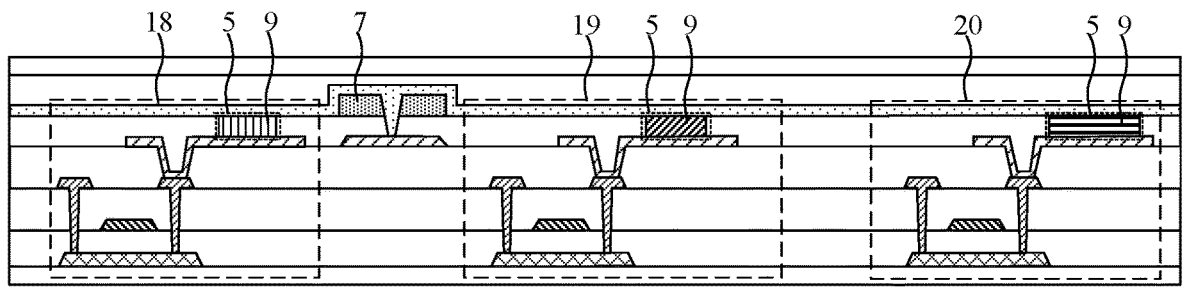
FIG. 8 illustrates a cross-sectional diagram taken along the line B1-B2 in FIG. 7.

Further, FIG. 8 illustrates a cross-sectional diagram taken along a direction of B1-B2 of FIG. 7. In conjunction with FIG. 7 and FIG. 8, an area of the first opening 5 corresponding to the red sub-pixel 18 and/or the green sub-pixel 19 is smaller than an area of the first opening 5 corresponding to the blue sub-pixel 20.

It can be understood that a region where the first opening 5 is located in a sub-pixel is a light-emitting region of said sub-pixel. Thus, on the one hand, the regions where the red sub-pixel 18 and the green sub-pixel 19 are located have larger space for arrangement of the first island portions 7; on the other hand, under the premise that the voltage drop of the negative power signal is not considered and other conditions are the same for different sub-pixels, the area of the first opening 5 corresponding to the red sub-pixel 18 and/or the green sub-pixel 19 is smaller than the area of the first opening 5 corresponding to the blue sub-pixel 20, such that the luminance of the red sub-pixel 18 and/or the green sub-pixel 19 is less than the luminance of the blue sub-pixel 20. However, when the voltage drop of the negative power signal is actually considered, since the first island portion 7 (the auxiliary conductive portion 11) is provided around the red sub-pixel 18 and/or the green sub-pixel 19, the resistance of the cathode 10 corresponding to the red sub-pixel 18 and/or the green sub-pixel 19 is smaller than the resistance of the cathode 10 corresponding to the blue sub-pixel 20. That is, compared with the blue sub-pixel 20, the attenuation degree of the negative power signal transmitted to the cathode 10 of the red sub-pixel 18 and/or the green sub-pixel 19 is smaller, such that the difference in luminance between the red sub-pixel 18, the green sub-pixel 19 and the blue sub-pixel 20 will be balanced, and the red sub-pixel 18, the green sub-pixel 19, and the blue sub-pixel 20 tends to have uniform luminance, thereby improving the display uniformity.

In one embodiment, with reference to FIG. 2 again, the first island portion 7 is a circular dam surrounding the via hole 8. When the first island portion 7 is a circular dam, the surface of the first island portion 7 is a curved smooth surface having no corner. Therefore, when the cathode 10 layer covers the first island portion 7, the risk of the cathode 10 layer being broken at the corner can be reduced. It is also conceivable that, in other alternative embodiments of the present disclosure, the first island portion 7 may also be a quadrate dam or a dam having other shapes surrounding the via hole 8, which is not limited herein.

Figure 9:
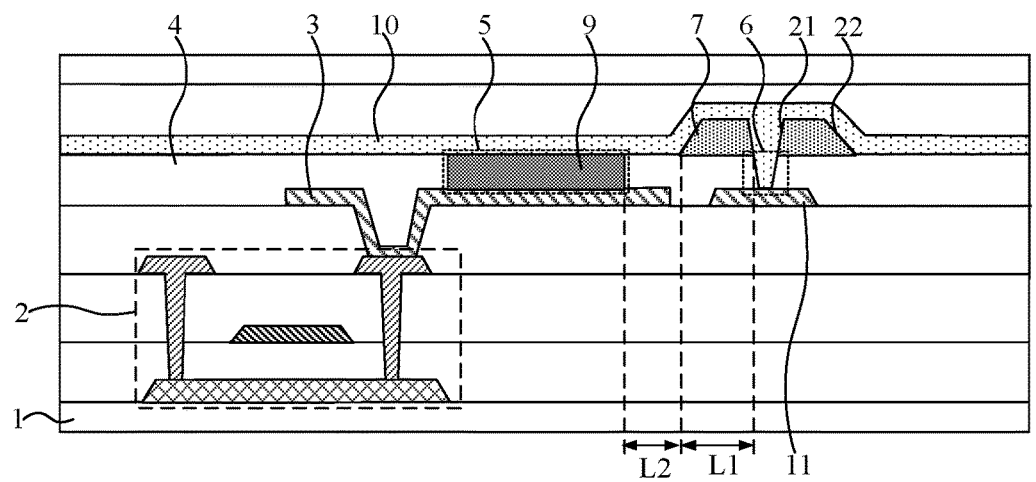
FIG. 9 illustrates a structural schematic diagram of the first island portion according to an embodiment of the present disclosure.

FIG. 9 illustrates a structural schematic diagram of the first island portion according to an embodiment of the present disclosure. As shown in FIG. 9, the first island portion 7 includes an inner side surface 21 and an outer side surface 22 surrounding the inner side surface 21, and an orthographic projection of the inner side surface 21 on the plane of the pixel defining layer 4 coincides with an edge of the second opening 6. With such configuration, the via hole 8 of the first island portion 7 and the second opening 6 of the pixel defining layer 4 together equate one through hole. The inner wall of the via hole 8 of the first island portion 7 and the inner wall of the second opening 6 of the pixel defining layer 4 together form a continuous corner-free surface, avoiding steps at the junction between the via hole 8 and the second opening 6. Moreover, the via hole 8 and the second opening 6 may be formed by a single etching process in the fabrication process.

In some embodiments, with reference to FIG. 9 again, along the direction from the base substrate 1 to the array layer 2, the outer side surface 22 is inclined toward the inner side surface 21. With such configuration, an included angle between the outer side surface 22 and a top surface of the first island portion 7 is a non-right angle. When the cathode 10 covers the outer side surface 22 and the top surface, the cathode 10 transitions more smoothly at a junction of the outer side-surface 22 and the top surface, thereby reducing the risk of breakage of the cathode 10.

In some embodiments, with reference to FIG. 9 again, a distance between the inner side surface 21 and the outer side surface 22 is L1, where $6\ \mu m \leq L1 \leq 10\ \mu m$. The setting that a minimum value of L1 is 6 μm can prevent the first island portion 7 from being too thin, and when depositing a luminescent material, the first island portion 7 can be used to effectively block the luminescent material to prevent the luminescent material from being deposited into the second opening 6; The setting that the maximum value of L1 is 10 μm can avoid the first island portion 7 occupying a large space, thereby avoiding the first island portion 7 occupying the space of the light-emitting region and affecting the aperture ratio of the display panel.

In some embodiments, with reference to FIG. 9 again, the minimum distance between the first island portion 7 and the first opening 5 is L2. In order to prevent the first island portion 7 from being too close to the first opening 5 to affect the light-emitting region, L2 satisfies: $L2 \geq 1.5\ \mu m$.

Figure 10:
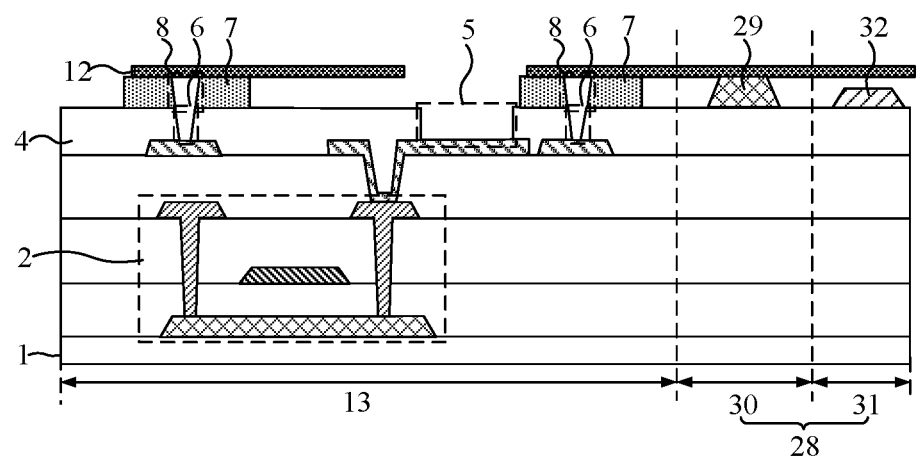
FIG. 10 illustrates a structural schematic diagram of a first support post and a second support post according to an embodiment of the present disclosure.

In some embodiments, as shown in FIG. 10, the display panel further includes a non-display region 28 surrounding the display region 13, and the non-display region 28 includes a first support post 29. When a high-precision metal mask 12 is used to form the organic light-emitting layer 9, the first support post 29 is used to support the high-precision metal mask 12. At this time, an opening of the high-precision metal mask 12 corresponds to the first opening 5 and a non-opening portion of the high-precision metal mask 12 covers the second opening 6 and the via hole 8, such that it can be achieved that the luminescent material is deposited to the first opening 5 only through the opening of the high-precision metal mask 12, that is, the second opening 6 and the via hole 8 are sealed by the first island portion 7 and the high-precision metal mask 12 so that the luminescent material will not be deposited into the second opening 6 and the via hole 8, thereby avoiding influence on subsequent electrical connection of the cathode 10 and the auxiliary conductive portion 11. In some embodiments, the first support post 29 has a height that is the same as a height of the first island portion 7 in a direction perpendicular to the plane of the base substrate 1.

It is also conceivable that, in some other embodiments of the present disclosure, the first island portion 7 is reused as the first support post 29. The use of the first island portion 7 to support the high-precision metal mask 12 simplifies the process flow, reduces the fabricating cost, and improves the support stability for the high-precision metal mask.

Further, with reference to FIG. 10 again, the non-display region 28 includes a first non-display region 30 and a second non-display region 31, the first non-display region 30 surrounding the display region 13, the second non-display region 31 surrounding the first non-display region 30 and the first support post 29 being located in the first non-display region 30. The display panel further includes a second support post 32, and the second support post 32 is located in the second non-display region 31. In a direction perpendicular to the plane of the base substrate 1, a height of the second support post 32 is smaller than the height of the first support post 31, and the second support post 32 is used to support an common mask (not shown in the drawing) that forms the cathode 10.

It should be noted that, since the cathode 10 is a film layer formed with an integral surface, the open mask includes an outer frame which surrounds an entire hollow area, and the hollow area corresponds to the pattern of the cathode 10. When the second support post 32 supports the open mask, the second support post 32 supports the outer frame of the open mask, such that an orthographic projection of the hollow area on the base substrate 1 covers the display region 13 and the first non-display region 30.

When the display panel is encapsulated by a thin film encapsulation layer, an organic encapsulation layer in the thin film encapsulation layer is generally formed by inkjet printing. Thus, the organic encapsulation layer has a thickness that is gradually reduced from the display region 13 toward the second non-display region 31, and it is easy to cause the thin film encapsulation layer to be punctured if the height of the second support post 32 is relatively large. However, in the embodiments of the present disclosure, the height of the second support post 32 in the second non-display region 31 is smaller than the height of the first support post 29, such that the thin film encapsulation layer can be prevented from being punctured so as to avoid encapsulation failure. Moreover, since a middle portion of the open mask is entirely hollow, the open mask will not be influenced by the first island portion 7 or the first support post 29 even if the height of the second support post 32 is smaller than the height of the first support post 29.

Further, in some other embodiments of the present disclosure, the first island portion 7 is reused as the first support post 29 and the height of the first island portion 7 is greater than the height of the second support post 32 in order to simplify the process flow.

In summary, by reusing the first island portions 7 as at least a portion of the support posts in the display panel, it is possible to simplify the fabrication process of the support posts, lower the fabricating cost, narrow the frame, and avoid the puncture of the thin film encapsulation layer.

In some embodiments, the first island portion 7 is made of a resin material, and the first island portion 7 is formed by using a resin material having no conductivity, such that the first island portion 7 can be prevented from affecting the negative power signal transmitted on the cathode 10.

Figure 11:
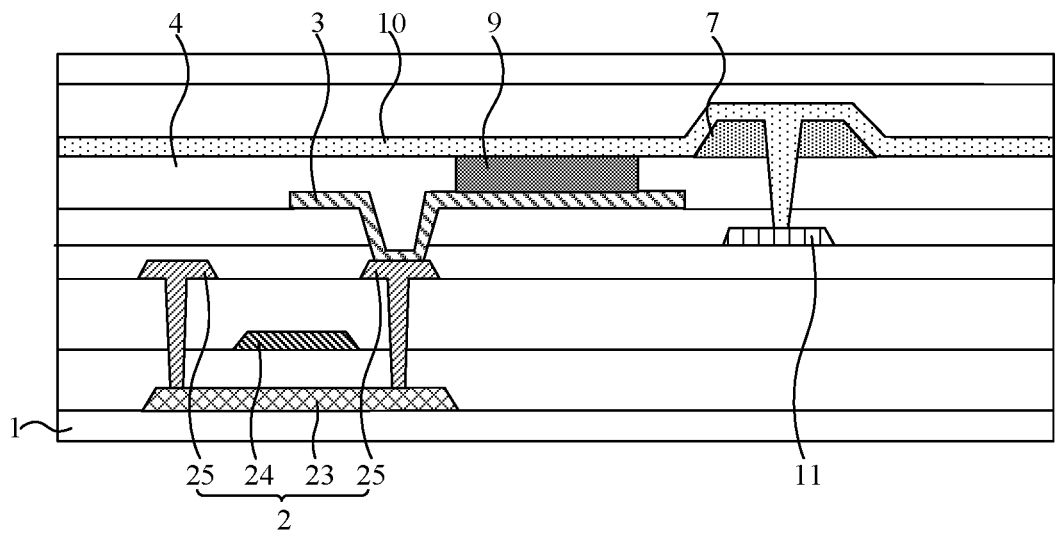
FIG. 11 illustrates a schematic diagram showing an arranging position of an auxiliary conductive portion according to an embodiment of the present disclosure.

FIG. 11 illustrates a schematic diagram of an arranging position of the auxiliary conductive portion according to an embodiment of the present disclosure. As shown in FIG. 11, the array layer 2 includes an active layer 23, a gate electrode 24, and a source-drain layer 25. In order to reduce the distance between the auxiliary conductive portion 11 and the cathode 10 and further improve the connection stability of the two, the auxiliary conductive portion 11 may be located between the source-drain layer 25 and the anode 3.

Figure 12:
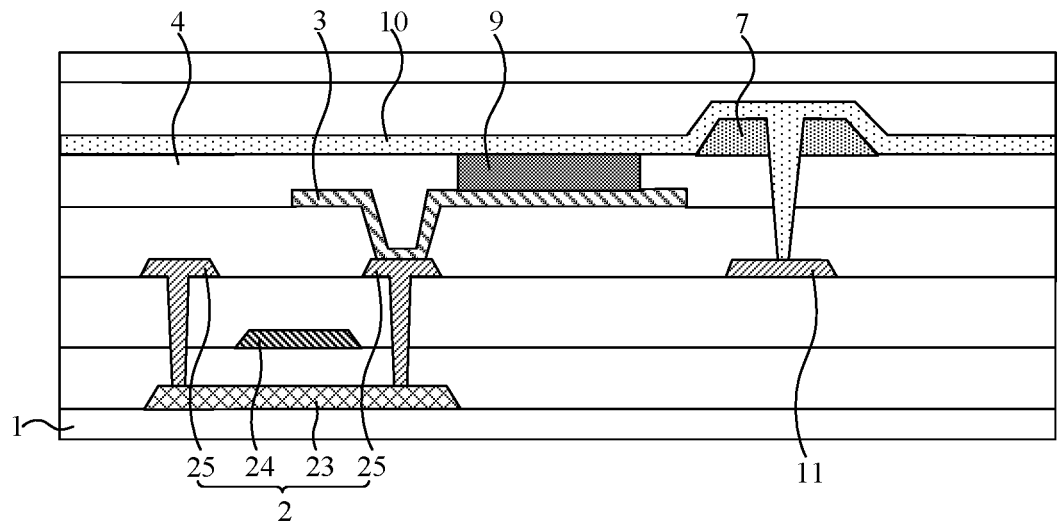
FIG. 12 illustrates a schematic diagram showing another arranging position of the auxiliary conductive portion according to an embodiment of the present disclosure.

FIG. 12 illustrates a schematic diagram of another arranging position of the auxiliary conductive portion according to an embodiment of the present disclosure. As shown in FIG. 12, the auxiliary conductive portion 11 may be arranged in the same layer as the gate 24, or the auxiliary conductive portion 11 may be arranged in the same layer as the source-drain layer 25. At this time, only one patterning process is needed to form the auxiliary conductive portion 11 and the gate electrode 24 or the source-drain layer 25 and no additional patterning processes are needed, which simplifies the process and lowers the fabricating costs.

Figure 13:
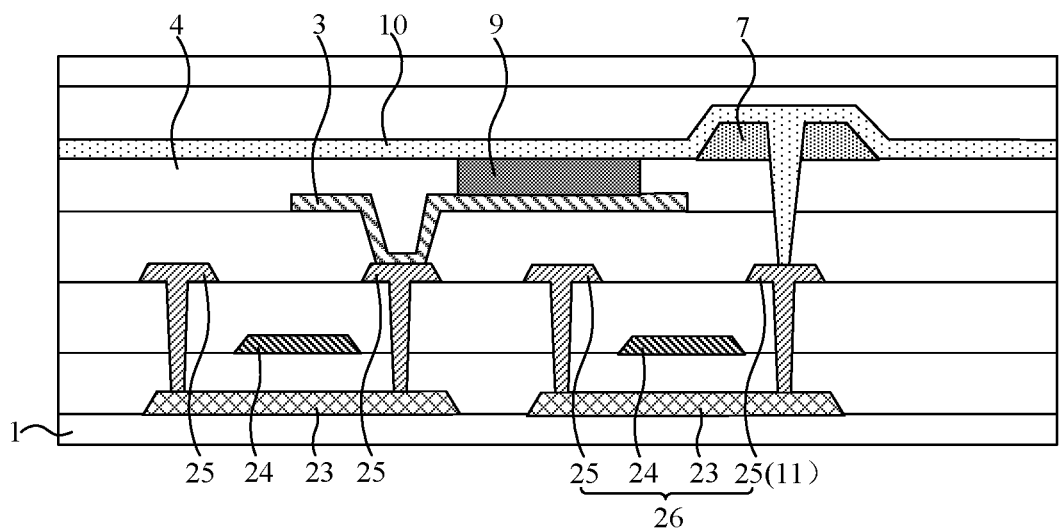
FIG. 13 illustrates a schematic diagram showing still another arranging position of the auxiliary conductive portion according to an embodiment of the present disclosure.

Further, FIG. 13 illustrates a schematic diagram showing still another arranging position of the auxiliary conductive portion according to an embodiment of the present disclosure. As shown in FIG. 13, the display panel further includes a pixel circuit, the pixel circuit includes a reset transistor 26, the reset transistor 26 includes an active layer 23, a gate electrode 24, and a source-drain layer 25. The source-drain layer 25 includes a source electrode and a drain electrode; the source or drain electrodes of the reset transistor 26 are reused as the auxiliary conductive portion 11. Since both a reset signal received by the source or the drain electrode of the reset transistor 26 and the negative power signal received by the cathode 10 are fixed low potential signals, when the source or the drain electrode of the reset transistor 26 is reused as the auxiliary conductive portion 11, there is no need to provide a reset signal line for transmitting the reset signal under the premise of achieving that the reset transistor 26 and the cathode 10 are normally operated, which only simplifies the fabrication process, but also saves the space occupied by the reset signal line in the display panel.

It should be noted that the pixel circuit further includes other transistor structures in addition to the reset transistor 26. The specific structure and working principle of the pixel circuit are the same as those in the related art, and will not be described herein again.

Figure 14:
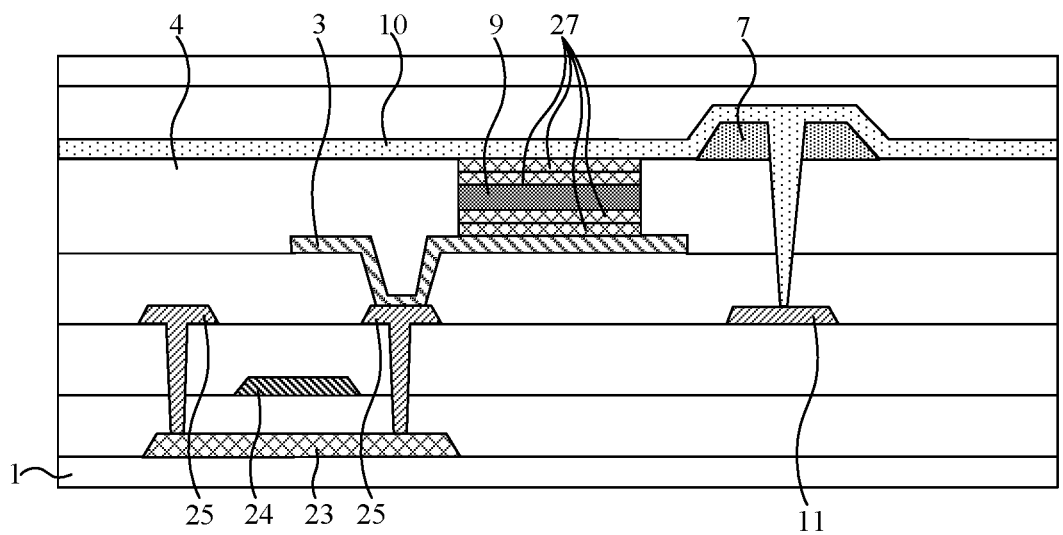
FIG. 14 illustrates a structural schematic diagram of an auxiliary function layer according to an embodiment of the present disclosure.

In addition, the display panel may further include an auxiliary function layer 27. FIG. 14 illustrates a structural schematic diagram of the auxiliary function layer according to an embodiment of the present disclosure. As shown in FIG. 14, the auxiliary function layer 27 includes a hole injection layer, a hole transmission layer, the hole injection layer and the hole transmission layer being located between the anode 3 and the organic light-emitting layer 9, and an electron transmission layer and an electron injection layer, the electron transmission layer and an electron injection layer being located between the organic light-emitting layer 9 and the cathode 10. An orthographic projection of the auxiliary function layer 27 on the base substrate 1 coincides with an orthographic projection of the organic light-emitting layer 9 on the base substrate 1, that is, both the auxiliary function layer 27 and the organic light-emitting layer 9 are formed using the high-precision metal mask 12. Since the first island portion 7 is arranged on the side of the pixel defining layer 4 facing away from the base substrate 1, when the auxiliary function layer 27 is formed by depositing an evaporation material, the evaporation material can still be blocked by the first island portion 7 and cannot be deposited into the second opening 6 at the time of being deposited obliquely along the opening of the high-precision metal mask 12.

In addition, it should also be noted that the diameter of the second opening 6 and the diameter of the via hole 8 can be set to be between 4 μm and 5 μm, so that the opening can satisfy the existing production process and can be formed by using an existing mask, thereby improving the feasibility of mass production of the display panel.

Figure 15:
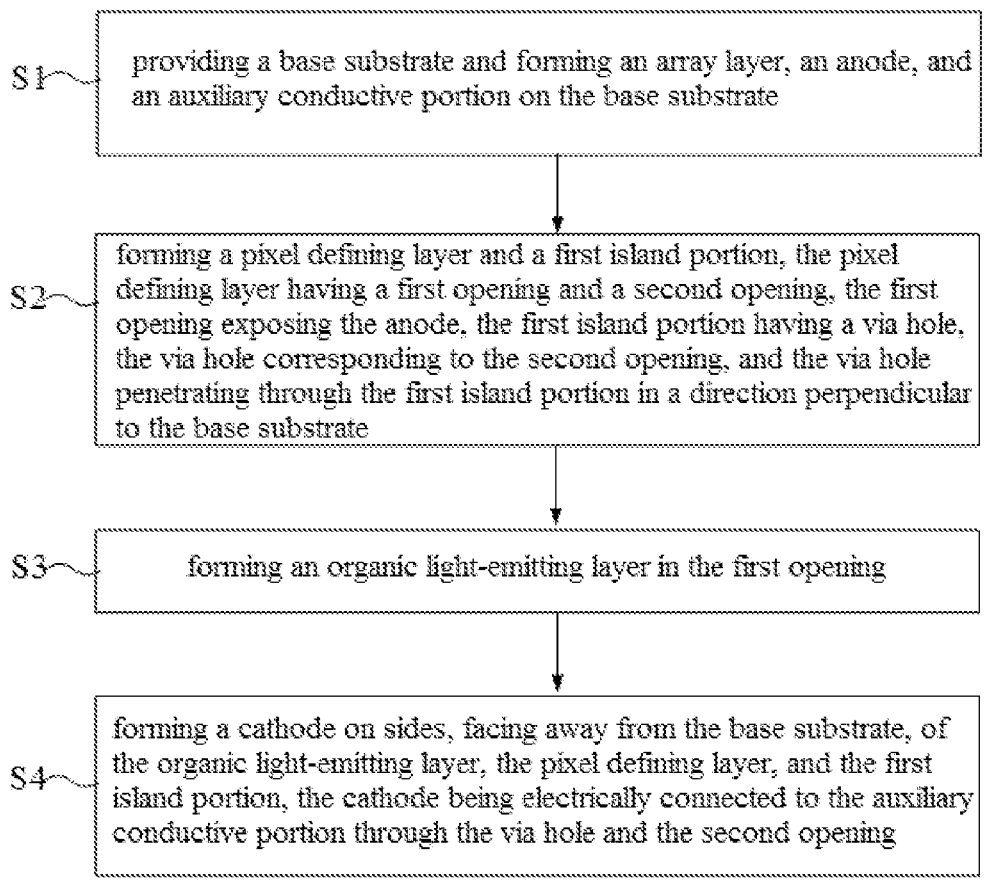
FIG. 15 illustrates a flowchart of a fabrication method according to an embodiment of the present disclosure.

Embodiment of the present disclosure further provide a fabrication method of a display panel, and the fabrication method is used to fabricate the above display panel. FIG. 15 illustrates a flowchart of a fabrication method according to an embodiment of the present disclosure. As shown in FIG. 15 and in combination with FIGS. 2-4, the fabrication method includes: Step S1 of providing a base substrate 1 and forming an array layer 2, an anode 3, and an auxiliary conductive portion 11 on the base substrate 1; Step S2 of forming a pixel defining layer 4 and a first island portion 7, the pixel defining layer 4 comprising a first opening 5 and a second opening 6, the first opening 5 exposing the anode 3, the first island portion 7 having a via hole 8, the via hole 8 corresponding to the second opening 6, and the via hole 8 penetrating through the first island portion 7 in a direction perpendicular to the base substrate 1; Step S3 of forming an organic light-emitting layer 9 in the first opening 5; and Step S4 of forming a cathode 10 on sides, facing away from the base substrate 1, of the organic light-emitting layer 9, the pixel defining layer 4, and the first island portion 7, the cathode 10 being electrically connected to the auxiliary conductive portion 11 through the via hole 8 and the second opening 6.

With the fabrication method provided by the embodiment of the present disclosure, by means of forming the first island portion 7 on the pixel defining layer 4, the first island portion 7 can be used to block the luminescent material used for forming the subsequent organic light-emitting layer 9, such that the connection stability between the cathode 10 and the auxiliary conductive portion 11 is improved and the total resistance of the cathode 10 is effectively reduced under the premise that the display panel has a high aperture ratio, thereby reducing the difference in voltage drop of the negative power signal generated when the negative power signal is transmitted at different regions of the cathode 10 and improving the display uniformity.

Figure 16:
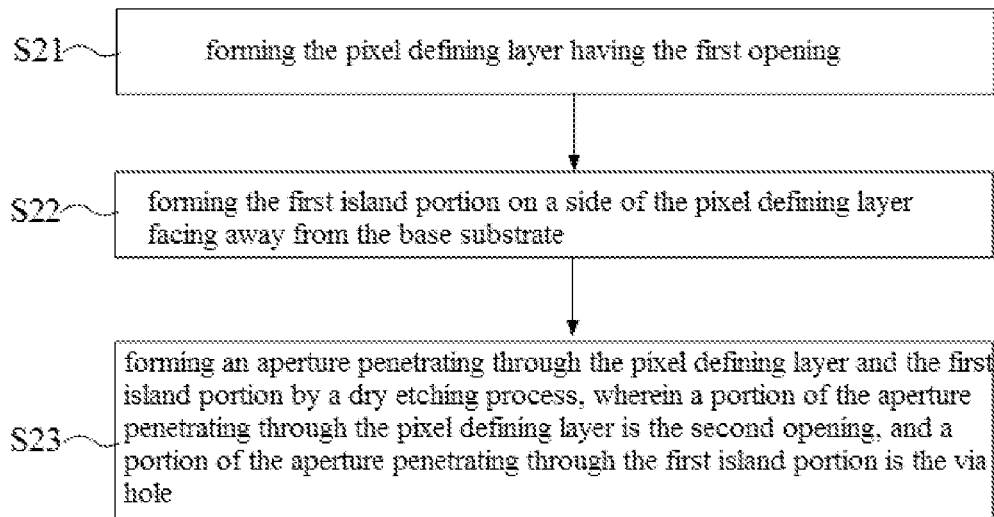
FIG. 16 illustrates a flowchart of step S2 according to an embodiment of the present disclosure.

FIG. 16 illustrates a flowchart of step S2 according to an embodiment of the present disclosure. As shown in FIG. 16, Step S2 may include: Step S21 of forming the pixel defining layer 4 having a first opening 5; Step S22 of forming the first island portion 7 on a side of the pixel defining layer 4 facing away from the base substrate 1; and Step S23 of forming an aperture penetrating through the pixel defining layer 4 and the first island portion 7 by using a dry etching process, and a portion of the aperture penetrating through the pixel defining layer 4 is a second opening 6, and a portion of the aperture penetrating through the first island portion 7 is the via hole 8.

Compared with the case in which the pixel defining layer 4 having the first opening 5 and the second opening 6 is formed first and then the first island portion 7 having the via hole 8 is formed, forming the second opening 6 of the pixel defining layer 4 and the via hole 8 of the first island portion 7 in one process enable the via hole 8 and the second opening 6 together to be one through hole, thereby avoiding steps at the junction between the second opening 6 and the via hole 8 and making the surfaces of the two smoother.

Figure 17:
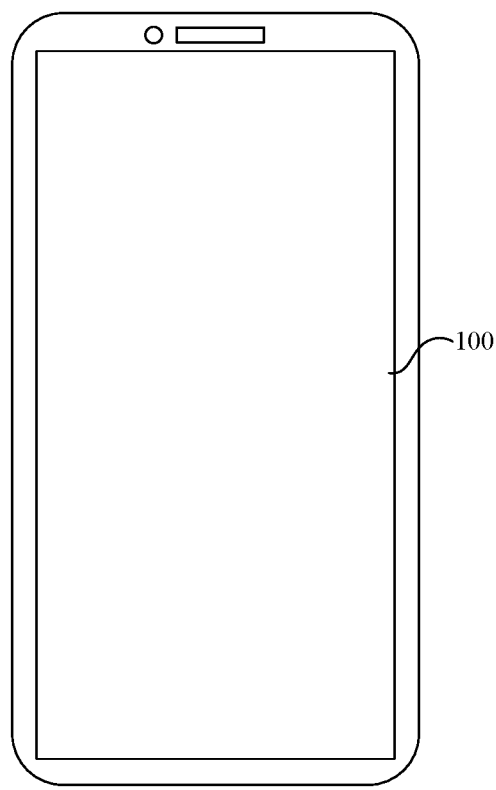
FIG. 17 illustrates a structural schematic diagram of a display device according to an embodiment of the present disclosure.

Embodiments of the present disclosure further provide a display device. FIG. 17 illustrates a structural schematic diagram of a display device according to an embodiment of the present disclosure. As shown in FIG. 17, the display device includes the display panel 100 above. The specific structure of the display panel 100 has been described in detail in the above embodiments, and will not be described herein again. The display device shown in FIG. 17 is merely illustrative, and the display device may be any electronic device having a display function such as a mobile phone, a tablet computer, a notebook computer, an e-book, and a television.

Since the display device provided by the embodiments of the present disclosure includes the above display panel, in the display device, the connection stability between the cathode 10 and the auxiliary conductive portion 11 is improved and the total resistance of the cathode 10 is effectively reduced under the premise of achieving that the display panel has a high aperture ratio, thereby reducing the difference in voltage drop of the negative power signal generated when the negative power signal is transmitted at different regions of the cathode 10 and improving the display uniformity of the display device.

The above-described embodiments are merely illustrative but not intended to provide any limitation to the present disclosure. Any modification, equivalent substitution, improvement, etc., made within the scope of the present disclosure is intended to be included within the protection scope of the present disclosure.

What is claimed is:
1. A display panel, comprising:
a base substrate;
an array layer disposed on the base substrate;
an anode located on a side of the array layer facing away from the base substrate;
a pixel defining layer located on a side of the anode facing away from the base substrate, the pixel defining layer having a first opening and a second opening, and the first opening exposing the anode;
a first island portion located on a side of the pixel defining layer facing away from the base substrate, the first island portion having a via hole, the via hole corresponding to the second opening, and the via hole penetrating through the first island portion in a direction perpendicular to the base substrate;
an organic light-emitting layer located on the side of the anode facing away from the base substrate, the organic light-emitting layer being defined by the first opening;
a cathode located on sides, facing away from the base substrate, of the organic light-emitting layer, the pixel defining layer, and the first island portion; and
an auxiliary conductive portion located between the pixel defining layer and the base substrate;
wherein the cathode is electrically connected to the auxiliary conductive portion through the via hole and the second opening, and wherein the first island portion is reused as a support post and wherein the first island portion is made of a resin material.

2. The display panel according to claim 1, wherein the first island portion is a circular dam surrounding the via hole.

3. The display panel according to claim 1, wherein the first island portion comprises an inner side surface and an outer side surface surrounding the inner side surface, and an orthographic projection of the inner side surface on a plane of the pixel defining layer coincides with an edge of the second opening.

4. The display panel according to claim 1, wherein the first island portion comprises an inner side surface and an outer side surface surrounding the inner side surface, and the outer side surface is inclined toward the inner side surface along a direction from the base substrate to the array layer.

5. The display panel according to claim 1, wherein the first island portion comprises an inner side surface and an outer side surface surrounding the inner side surface, and a distance between the inner side surface and the outer side surface is L1, where 6 μm≤L1≤10 μm.

6. The display panel according to claim 1, wherein a minimum distance between the first island portion and the first opening is L2, where L2≥1.5 μm.

7. The display panel according to claim 1, wherein the array layer comprises an active layer, a gate electrode and a source-drain layer; and
the auxiliary conductive portion is located between the source-drain layer and the anode.

8. The display panel according to claim 1, wherein the array layer comprises an active layer, a gate electrode and a source-drain layer; and
the auxiliary conductive portion is arranged in a same layer as the gate electrode, or the auxiliary conductive portion is arranged in a same layer as the source-drain layer.

9. The display panel according to claim 1, further comprising:
a pixel circuit, the pixel circuit comprising a reset transistor, the reset transistor comprising an active layer, a gate electrode and a source-drain layer, the source-drain layer comprising a source electrode and a drain electrode; and
the source electrode or the drain electrode of the reset transistor is reused as the auxiliary conductive portion.

10. The display panel according to claim 1, wherein the base substrate has a display region and the first island portion is located in the display region.

11. The display panel according to claim 10, wherein the display region comprises a plurality of pixel regions, and each of the plurality of pixel regions is provided with a plurality of sub-pixels; and
the display panel comprises a plurality of first island portions, and each of the plurality of pixel regions is provided with one of the plurality of first island portions.

12. The display panel according to claim 11, wherein the first island portion in each of the plurality of pixel regions is located at a geometric center of the pixel region.

13. The display panel according to claim 11, wherein the display region comprises a first display region and a second display region, the first display region is located at a side of the second display region adjacent to an edge of the display region, the plurality of first island portions are distributed in the first display region and the second display region, and a distribution density of the plurality of first island portions in the first display region is smaller than a distribution density of the plurality of first island portions in the second display region.

14. The display panel according to claim 11, wherein sub-pixels of the display region comprise red sub-pixels, green sub-pixels and blue sub-pixels, and the plurality of first island portions is adjacent to the red sub-pixels and/or the green sub-pixels but not adjacent to the blue sub-pixels.

15. The display panel according to claim 14, wherein the red sub-pixels, the green sub-pixels, and the blue sub-pixels are alternately arranged in a first direction and sub-pixels of a same color of the red sub-pixels, the green sub-pixels, and the blue sub-pixels are aligned in a second direction, the first direction intersecting with the second direction.

16. The display panel according to claim 14, wherein each sub-pixel of the red sub-pixels, the green sub-pixels, and the blue sub-pixels corresponds to one first opening, and an area of the first opening corresponding to one of the red sub-pixels and/or the green sub-pixels is smaller than an area of the first opening corresponding to one of the blue sub-pixels.

17. A method for fabricating a display panel, comprising:
providing a base substrate and forming an array layer, an anode, and an auxiliary conductive portion on the base substrate;
forming a pixel defining layer and a first island portion, the pixel defining layer having a first opening and a second opening, the first opening exposing the anode, the first island portion having a via hole, the via hole corresponding to the second opening, and the via hole penetrating through the first island portion in a direction perpendicular to the base substrate;
forming an organic light-emitting layer in the first opening; and
forming a cathode on sides, facing away from the base substrate, of the organic light-emitting layer, the pixel defining layer, and the first island portion, the cathode being electrically connected to the auxiliary conductive portion through the via hole and the second opening,
wherein the first island portion is reused as a support post and wherein the first island portion is made of a resin material.

18. The method for fabricating the display panel according to claim 17, wherein said forming the pixel defining layer and the first island portion comprises:
forming the pixel defining layer having the first opening;
forming the first island portion on a side of the pixel defining layer facing away from the base substrate; and
forming an aperture penetrating through the pixel defining layer and the first island portion by a dry etching process, wherein a portion of the aperture penetrating through the pixel defining layer is the second opening, and a portion of the aperture penetrating through the first island portion is the via hole.

19. A display device, comprising:
a display panel, comprising:
a base substrate;
an array layer disposed on the base substrate;
an anode located on a side of the array layer facing away from the base substrate;
a pixel defining layer located on a side of the anode facing away from the base substrate, the pixel defining layer having a first opening and a second opening, and the first opening exposing the anode;
a first island portion located on a side of the pixel defining layer facing away from the base substrate, the first island portion having a via hole, the via hole corresponding to the second opening, and the via hole penetrating through the first island portion in a direction perpendicular to the base substrate;

an organic light-emitting layer located on the side of the anode facing away from the base substrate, the organic light-emitting layer being defined by the first opening;

a cathode located on sides, facing away from the base substrate, of the organic light-emitting layer, the pixel defining layer, and the first island portion; and an auxiliary conductive portion located between the pixel defining layer and the base substrate;

wherein the cathode is electrically connected to the auxiliary conductive portion through the via hole and the second opening, wherein the first island portion is reused as a support post and wherein the first island portion is made of a resin material.

\* \* \* \* \*